United States Patent [19]

Nakamura et al.

[11] 4,353,030

[45] Oct. 5, 1982

[54] PULSE FREQUENCY MULTIPLIER CIRCUIT

[75] Inventors: Hideo Nakamura, Tokyo; Tsuneo Funabashi, Hachioji; Haruo Koizumi, Tokyo, all of Japan

[73] Assignee: Hitachi, Ltd., Tokyo, Japan

[21] Appl. No.: 184,312

[22] Filed: Sep. 5, 1980

[30] Foreign Application Priority Data

Sep. 10, 1979 [JP] Japan ................................ 54/115297

[51] Int. Cl.³ .............................................. H03K 5/00
[52] U.S. Cl. ................................... 328/38; 307/225 R
[58] Field of Search ................ 328/16, 38; 307/225 R

[56] References Cited

U.S. PATENT DOCUMENTS

| | | | |
|---|---|---|---|
| 3,262,069 | 7/1966 | Stella | 328/38 X |
| 3,443,463 | 5/1969 | Campbell | 307/225 R |
| 3,743,946 | 7/1974 | Gass et al. | 328/38 X |
| 3,832,640 | 8/1974 | Cederquist et al. | 328/38 |

*Primary Examiner*—John S. Heyman
*Attorney, Agent, or Firm*—Antonelli, Terry & Wands

[57] ABSTRACT

In a pulse frequency multiplying circuit, a first capacitor charged to a given potential is discharged through a first constant-current circuit during a period corresponding to a pulse width of a reference pulse. Then, the terminal voltage of the first capacitor is applied as a reference voltage to one input terminal of a comparator circuit. A triangle wave voltage formed by alternately discharging a pair of second capacitors charged to a given potential, through a second constant-current circuit with a current value n times that in the first constant-current circuit, is applied to the other input terminal of the comparator circuit. The output from the comparator circuit operates a flip-flop circuit. In accordance with the output signal, the charge/discharge operation of said second capacitors is switched, whereby said flip-flop circuit produces a pulse with a frequency n times that of the reference pulse.

6 Claims, 15 Drawing Figures

PULSE FREQUENCY MULTIPLIER CIRCUIT

The present invention relates to a pulse frequency multiplier and, more particularly, to a pulse frequency multiplier circuit well suitable for LSI fabrication which may produce an internal clock signal of a given frequency properly multiplied on the basis of a clock pulse externally applied.

With a progress of the LSI technology, control systems using a microprocessor (hereinafter referred to as MPU) have been actively developed. Of this type control system, a system particularly requiring a high precision control generally employs a system arrangement that a peripheral LSI is disposed between the MPU and a terminal equipment either to be controlled or processed and the MPU mainly processes required data whereas the peripheral LSI controls data transfer between the MPU and the terminal equipment. In that case, the peripheral LSI receives input data at the timing of the terminal side and rearranges it into a data format such as an 8-bit parallel data for transfer to the MPU. Conversely, when it receives the data with such a format from the MPU, the peripheral LSI produces a pulse width, a train of pulses, an on/off signal or an analog signal which corresponds to the data received, and transfers those at the timing of the terminal side.

In the above-mentioned control system, when high speed is not required for the control of the logics of the terminal equipment and the peripheral LSI, a synchronizing clock delivered from the MPU may be used for a control clock pulse within the peripheral LSI as it is. However, when the peripheral LSI must be operated at high precision and at high speed, an MPU synchronizing clock, for example, a control clock pulse faster than 1 MHz is required for the peripheral LSI.

For example, when the logic circuit is constructed by dynamic gates in order to fabricate the peripheral LSI in high density and to reduce the power consumption of the peripheral LSI, the circuit operation depends on a clock frequency and hence it needs a high speed control clock pulse. Further, if the internal clock of the peripheral LSI is faster, an amount of data processed within a fixed time is increased. As a result, it is possible for a single peripheral LSI to control a multiple of terminal equipments. Accordingly, a high performance system may be made small in size, while in that case, a high speed control clock pulse is required.

The simplest method of speeding up the internal clock of the peripheral LSI is to produce a clock exclusively used for that peripheral LSI by a separate clock generator independently of that of the MPU. However, since this method thus uses the additional clock system to that of the MPU, it is difficult to synchronize the MPU with the peripheral LSI. In addition, when the high speed clock necessary for the peripheral LSI is used for an overall system, it cannot be adapted for the current MPU.

Accordingly, in order to increase the operation speed of the peripheral LSI coupled with the MPU, it is necessary to use a pulse frequency multiplier circuit adaptable for the LSI fabrication which can produce an internal clock of a frequency n times that of a periodical signal applied from the MPU on the basis of the periodical signal.

So far as we know, however, the conventional pulse frequency multiplier system is unsuitable for the high speed and precision pulse generating system required for the internal clock pulse of the peripheral LSI.

For example, a PLL (phase lock loop) system which is generally used as the pulse frequency multiplier system has a shortcoming that there occurs an error in the pulse width of the output pulse within the interval of pulses produced by a high frequency oscillator contained. In this respect, it is unsuitable for the pulse frequency multiplier circuit for the peripheral LSI.

There is another proposal of the pulse wave multiplier which obtains a frequency n times a reference pulse frequency by using a couple of triangle wave voltage generating circuits, as disclosed in Japanese Post-Exam Patent Publication No. 26980/77. In this proposal, a first triangle wave voltage generating circuit produces a first triangle wave voltage with the same period as that of the reference pulse. The peak value of the first triangle wave voltage generated is held by a hold circuit. The peak value held is attenuated to 1/n by an attenuator. The 1/n voltage is applied to one input terminal of a comparator. The second triangle wave voltage generating circuit produces a second triangle wave voltage which changes from a reference level with the same inclination as that of the first triangle wave voltage, and when it is reset, it will return to the reference level and change again with the above inclination. The second triangle wave voltage is applied to the other input terminal of the comparator. The comparator, when both the triangle wave voltages are coincident with each other, will produce an output pulse signal. In response to the output pulse signal, a reset circuit resets the second triangle wave voltage generating circuit.

This proposal may obtain a frequency any number of times that of the reference pulse, ideally. When it is assembled into a practical circuit, especially LSI, however, it is difficult to attenuate the first triangle wave voltage accurately into the 1/n value. Furthermore, it is impossible to reduce the reset time of the second triangle wave voltage to zero. Consequently, it is difficult to obtain a desired frequency multiplied.

Accordingly, an object of the invention is to provide a pulse frequency multiplier circuit which may accurately produce a pulse with a frequency any number of times that of a reference pulse externally applied.

Another object of the invention is to provide a pulse frequency multiplier circuit well adaptable in the circuit arrangement for LSI fabrication, especially for the LSI constructed by MOS type elements.

Yet another object of the present invention is to provide a pulse frequency multiplier circuit which is little affected by a variation in the characteristic due to a characteristic variation of elements in manufacturing LSI and temperature variation.

To achieve the above-mentioned object, there is provided a pulse frequency multiplier circuit comprising: a reference voltage generating circuit which, after a first capacitor charged to a given potential is discharged at a fixed voltage attenuating rate for a period corresponding to the pulse width of a reference pulse, produces the terminal voltage of the first capacitor as a reference voltage; a triangle wave voltage generating circuit which alternately discharges a pair of second capacitors charged to a given potential at a voltage attenuating rate n times that of the first capacitor, and alternately produces in a triangle wave shape an attenuated voltage obtained at the terminal of the second capacitors during the discharge period; a comparator circuit for producing a pulse when the reference voltage is coincident with the triangle wave voltage; a flip-flop circuit which is driven by an output pulse from the comparator circuit; and a timing pulse generating circuit which responds to an output pulse from the flip-flop circuit and produces a timing signal for switching the charge/discharge operation of each of the second capacitors for transfer to the triangle wave voltage generating circuit, whereby a pulse of a frequency n times of the reference pulse is produced from the flip-flop circuit.

With such a circuit arrangement, a pulse width of a reference pulse (a synchronizing pulse derived from the MPU, for example) is converted into a voltage value by the reference voltage generating circuit. The converted voltage value is compared with a triangle wave voltage output from a triangle wave voltage generating circuit. A rate of attenuation of the triangle wave voltage depends on a capacitance of the second capacitor and a current value in a constant-current circuit with which a discharging circuit is provided. In that case, the absolute value of the current need not be taken into consideration.

In the present invention, a multiplying ratio n of the frequency depends on a relative relation of the voltage attenuating rates of the first and second capacitors. For example, when the first and second capacitors are designed with the same physical dimension, a triangle wave which reaches a reference voltage for a 1/n period of the pulse width of the reference pulse may be obtained merely by selecting the current value of the second constant-current circuit for discharging the second capacitor at a constant-current to be n times the current value of the first constant-current circuit for discharging the first capacitor at a constant current. The constant-current circuit may readily be fabricated into LSI by taking advantage of the saturated operating region of the MOS transistor. The second constant-current circuit may be assembled by n pieces of the first constant-current circuits with the same structure arranged in parallel. Accordingly, a value of the n may be selected at random and accurately. Alternatively, the first and second constant-current circuits are so designed to have the same current value but the capacitances of the first and second capacitors are selected to have the ratio of 1:n. This may also be realized merely by selecting the area ratio of the two capacitors to be n:1.

According to the invention, the reference voltage generating circuit and the triangle wave voltage generating circuit, which produce two voltages to be compared, are analogous in the structure, so that a good relative accuracy is easily obtained between them and that the characteristic variation due to the LSI fabrication and the temperature dependency are offset by a reference voltage change. A shift of the period of the output pulse, if it would be caused, may automatically be corrected by controlling a capacitor discharging time of the reference voltage generating circuit by timing pulses generated by a timing pulse generating circuit.

The foregoing and other objects, advantages, manner of operation and novel features of the present invention will be understood from the following detailed description when reading in connection with the accompanying drawings, in which:

FIG. 5b is graphical representation for illustrating the operation of the comparator circuit shown in FIG. 5a;

Figure 1:
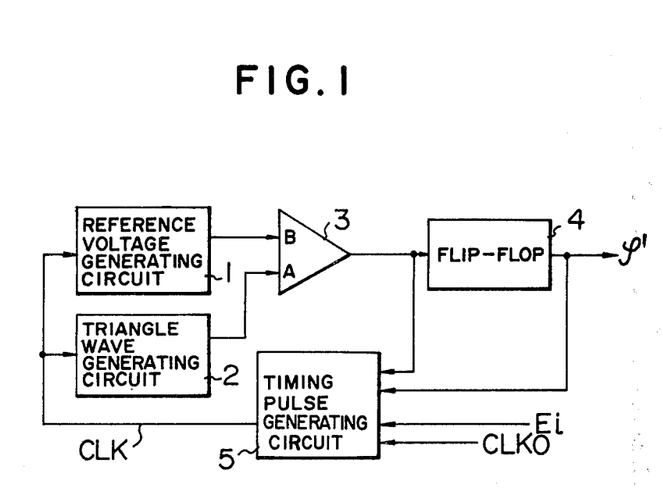
FIG. 1 is a block diagram of a basic construction of a pulse frequency multiplier circuit according to the present invention.

Reference is made to FIG. 1 illustrating a basic construction of a pulse frequency multiplier circuit according to the present invention. In the figure, reference numeral 1 designates a circuit for generating a reference voltage corresponding to an input period of a reference pulse, 2 a circuit for generating a triangle wave signal by repeating a voltage attenuating with time, 3 a comparator circuit for producing a pulse when the triangle wave voltage inputted to a terminal A is coincident with the reference voltage inputted to a terminal B, 4 a flip-flop circuit driven by an output pulse from the comparator circuit 3, 5 a timing pulse generating circuit. The timing pulse generating circuit 5 responds to an incoming reference pulse Ei externally applied (from an MPU, for example), a start pulse CLK0 and respective output pulses from the comparator circuit 3 and the flip-flop circuit 4, operates the reference voltage generating circuit 1 and the triangle voltage generating circuit 2 by using those input pulses, and produces necessary various timing pulses CLK (CLK1 to CLK11). Then, the triangle wave voltage generating circuit 2 produces a triangle wave voltage at 1/n period of that of the incoming reference pulse Ei and the flip-flop circuit 4 produces a pulse $\psi'$ of the frequency n times that of the incoming reference pulse.

Figure 2:
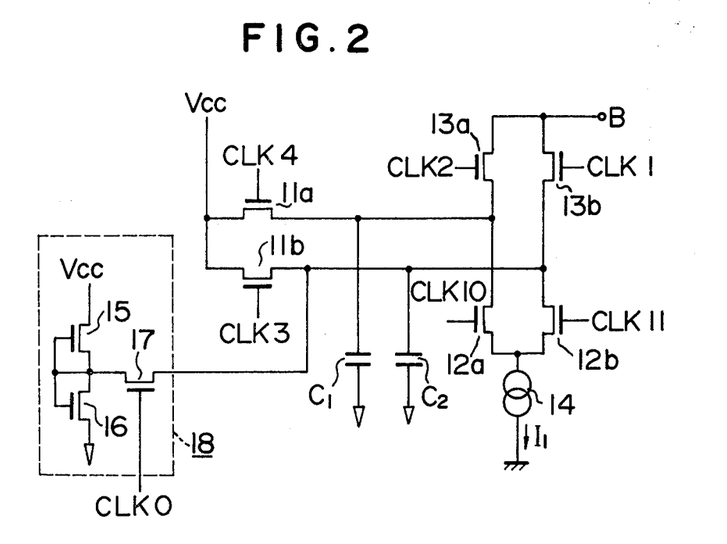
FIG. 2 is a circuit diagram of an embodiment of a reference voltage generating circuit used in the circuit shown in FIG. 1.

Turning now to FIG. 2, there is shown a circuit diagram a detailed circuit arrangement of the reference voltage generating circuit 1. The reference voltage generating circuit includes a pair of capacitors $C_1$ and $C_2$ with the same capacitances and a constant-current circuit 14 of a current value $I_1$. The capacitor $C_1$ is connected through a MOS switch (hereinafter referred to as a switch) 11a to a power source Vcc, through a switch 12a to the constant-current circuit 14, and through a switch 13a to an output terminal B (corresponding to the terminal B of the comparator circuit 3). Similarly, the capacitor $C_2$ is connected through the switches 11b to 13b to a power source Vcc, the constant-current circuit 14 and the output terminal B. These switches are controlled in their on/off operations by the pulse signals CLK1 to CLK4, CLK10 and CLK11 shown in FIG. 11.

Figure 10:
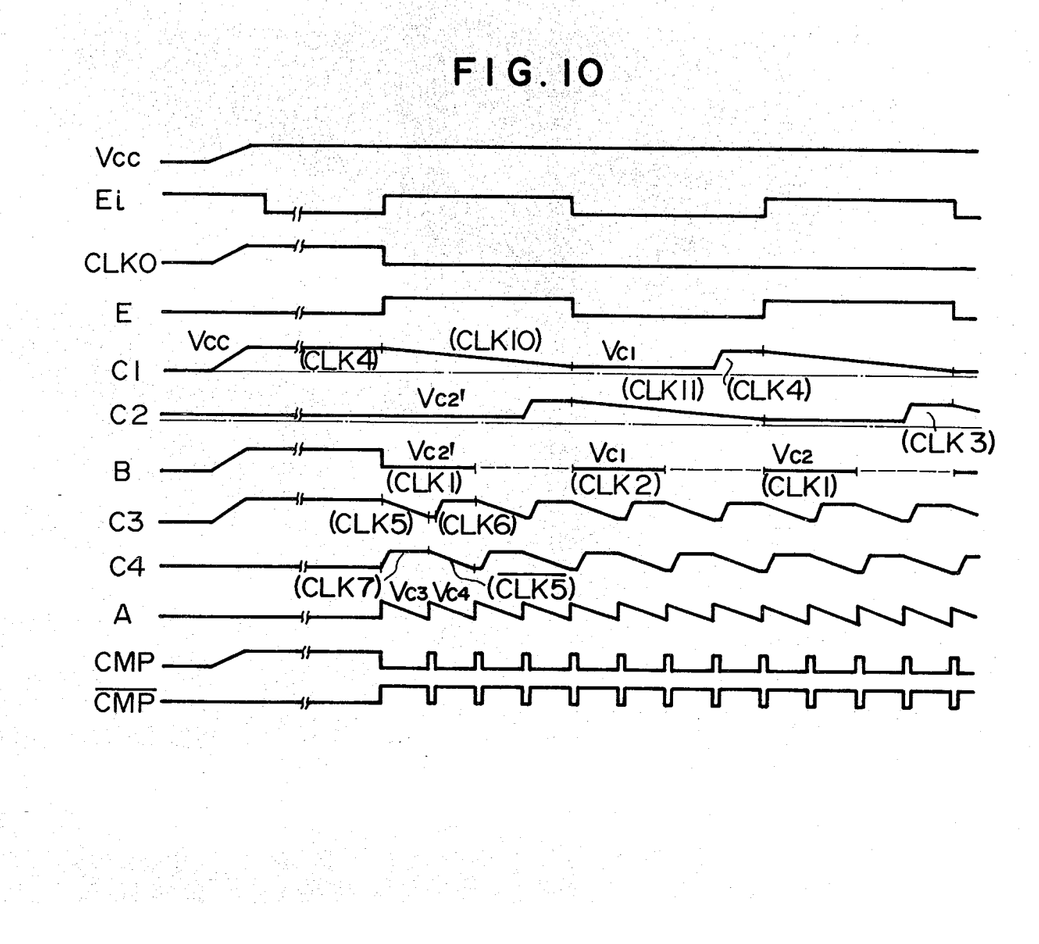
FIGS. 10 and 11 are waveforms of various pulse signals in the respective portions in the above embodiments.

The operation of the reference voltage generating circuit 1 will be described referring to signal waveforms shown in FIG. 10. In FIG. 10, a reference pulse E is a pulse which is the incoming pulse Ei of the duty ratio 50% externally inputted to the circuit of the invention which is applied to the inner circuit after the application of the start pulse CLK0.

The capacitor $C_1$ is connected to a power source Vcc via the switch 11a for the output duration of the pulse CLK4 and is charged up to a given potential, as indicated by a waveform C1. During the output period of the pulse CLK10 produced when the reference pulse E is at a high level, the capacitor $C_1$ is discharged at a fixed voltage attenuating rate through the switch 12a and the constant-current circuit 14. During the output period of the pulse CLK2, the residual voltage Vc1 is outputted to the output terminal B through the switch 13a. On the other hand, the capacitor $C_2$ is subjected to the charging, discharging and outputting of the residual voltage Vc2 in response to the pulses CLK3, CLK10, and CLK1, correspondingly and respectively, which are generated at the timing half-phase shifted relative to the above-mentioned pulses. Since the two capacitors $C_1$ and $C_2$ are charged with the same voltage Vcc and are discharged through the common constant-current circuit 14, if the capacitances of both the capacitors are selected to be equal to each other and the pulse widths of the pulses CLK10 and CLK11 are similarly equal to each other, a reference voltage Vc1=Vc2 proportional to the pulse width of the reference pulse E appears at the output terminal B refreshingly every half cycle.

In FIG. 2, a circuit 18 including MOS transistors 15, 16 and 17 is used for applying a temporary reference voltage Vc2' to the comparator circuit 3 at the time of start. The comparator circuit 3 operates with the comparing voltage of the Vc2' only for the first half cycle of the input pulse and operates with the reference voltage Vc1 and Vc2 corresponding to the reference pulse E, subsequently.

Figure 3:
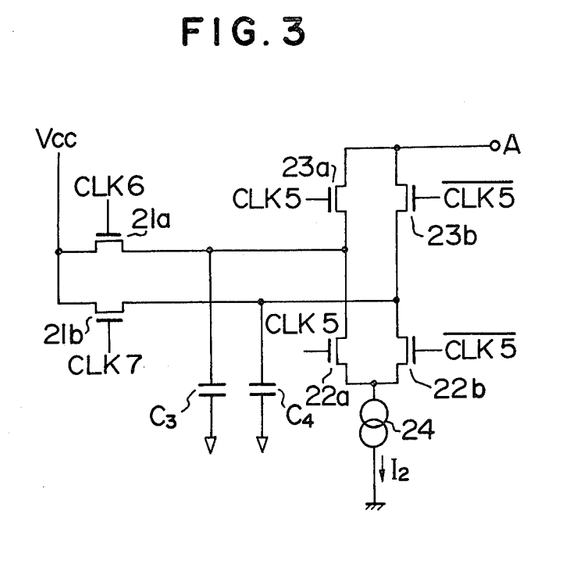
FIG. 3 is a circuit diagram of an embodiment of a triangle wave voltage generating circuit 2 used in the circuit shown in FIG. 1.
Figure 4:
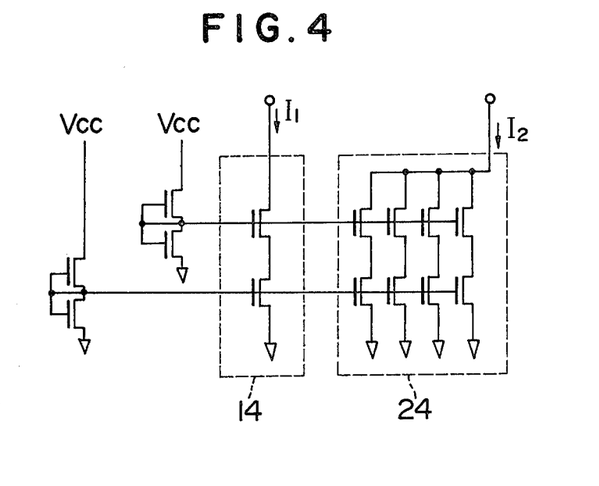
FIG. 4 is a circuit diagram of an embodiment of a constant-current circuit which may be applied for the circuits 1 and 2.

FIG. 3 shows a detailed circuit arrangement of the triangle wave voltage generating circuit 2. As shown, the triangle voltage generating circuit is comprised of a pair of capacitors $C_3$ and $C_4$, the constant-current circuit 24 and switches 21a to 23a, and 21b to 23b. The same is analogous in structure to the reference voltage generating circuit 1. A condition required for generating a triangle wave voltage at a 1/n period of the reference pulse is that the capacitances of the capacitors $C_3$ and $C_4$ are equal to those of the capacitors $C_1$ and $C_2$, and the current $I_2$ of the constant-current circuit 24 is n times that $I_1$ of the constant-current circuit 14 or that the currents $I_1$ and $I_2$ are equal to each other and the capacitances of the capacitors $C_3$ and $C_4$ are 1/n of those of the capacitors $C_1$ and $C_2$. In the former case, all a designer has to do is to arrange n parallel connected constant-current circuits 14 each including a pair of MOS transistors for the construction of the constant-current circuit 24, as shown in FIG. 4.

In the circuit in FIG. 3, the capacitor $C_3$ is charged up to a constant potential Vcc during the output period of the pulse CLK6 and is discharged through the constant-current circuit 24 during the period of the pulse CLK5. The terminal voltage Vc3 across the capacitor $C_2$ being currently discharged is outputted to the terminal A through the switch 23a. The capacitor $C_4$ is charged during the output period of the pulse CLK7 shifted by half-phase to relative to the pulse CLK6. The discharge of the capacitor $C_4$ and the outputting of the terminal voltage are performed during the output period of the period $\overline{CLK5}$.

The terminal voltages Vc3 and Vc4 across the capacitors $C_3$ and $C_4$ during the discharge periods descend at a rate n times the terminal voltage attenuating rate of each capacitor $C_1$ and $C_2$ of the reference voltage generating circuit. Accordingly, a time required for the terminal voltages Vc3 and Vc4 to reach the reference voltage Vc1 or Vc2 is 1/n of the pulse width of the reference pulse E. As described later, the triangle wave voltage outputted from the terminal A is compared with the reference voltage in the comparator circuit 3. When both the voltages coincide with each other, the comparator circuit produces a pulse. In synchronism with the output pulse from the comparator circuit, the level of the pulse CLK5 is inverted, so that the pulses CLK6 and CLK7 are produced alternately. Therefore, the terminal voltages across the capacitors $C_3$ and $C_4$ and the output voltage from the terminal A change like signal waveforms C3, C4 and A in FIG. 10.

Figure 5A:
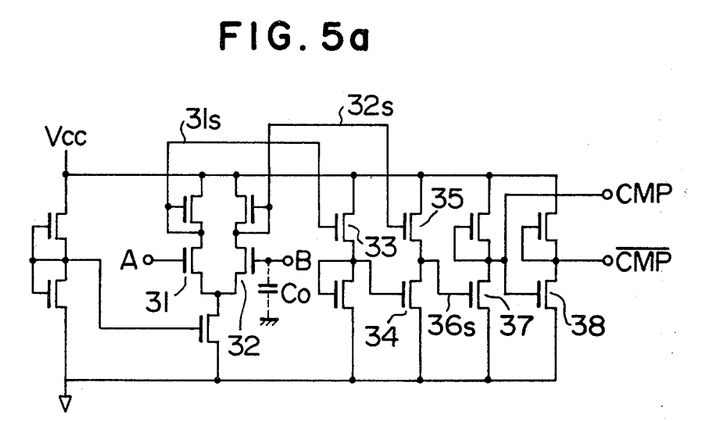
FIG. 5a is a circuit diagram of a comparator circuit 3 used in the circuit shown in FIG. 1.

FIG. 5a shows a circuit arrangement of the comparator circuit 3. In the figure, MOS transistors (hereinafter referred to as Tr) 31 and 32 constitute a differential amplifier, of which the gates also constitute the terminals A and B. An output signal 31s of the Tr 31 is applied to a Tr 33 forming a level shift circuit where it is level-shifted. The level-shifted signal is applied to a Tr 34. The output signal 32s of the Tr 32 is inputted to a Tr 35. The transistors Tr 34 and Tr 35 constitute a push-pull circuit. In the push-pull circuit, when a signal level at the terminal A is lower than that at the terminal B, the Tr 34 is turned on while the Tr 35 is turned off. Therefore, the output signal 36s becomes low "0" in level. The output signal 36s of the push-pull circuit is inputted to a Tr 37 constituting an inverter circuit. The signal inverted by the inverter becomes an output signal CMP of the comparator circuit. The signal CMP is applied to a Tr 38 forming another inverter which in turn produces an output signal $\overline{CMP}$.

Figure 5B:
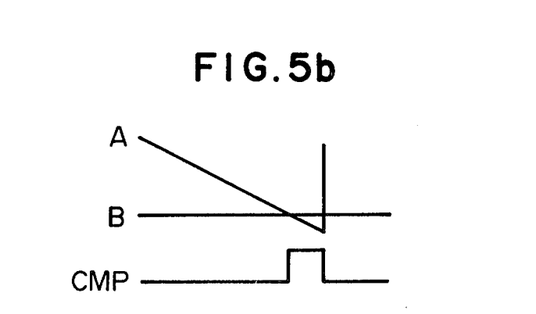

Accordingly, the comparator circuit, as shown in FIG. 5b, produces the pulse signal CMP which becomes "1" level when the triangle wave voltage inputted to the terminal A is coincident with the reference voltage inputted to the terminal B, and also produces the inverted pulse signal $\overline{CMP}$.

As indicated by a signal waveform B in FIG. 10, an output voltage from the reference voltage generating circuit 1 is intermittently applied to the terminal B in synchronism with the pulses CLK1 and CLK2. The voltage applied is held by an input terminal stray capacitor Co of the comparator circuit. For that reason, no input period of the reference voltage, even if it occurs, gives rise to no problem in the operation of the comparator circuit. The reference voltage generating circuit 1 according to the invention does not necessarily use the two capacitors $C_1$ and $C_2$ but may use only the reference voltage obtained from a single capacitor.

Figure 6:
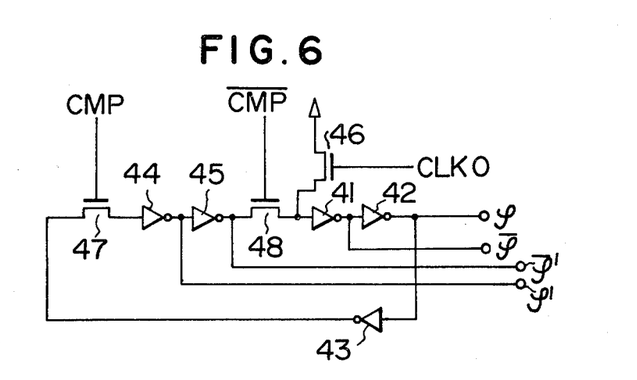
FIG. 6 is a circuit diagram of an embodiment of a flip-flop circuit 4 used in the circuit shown in FIG. 1.
Figure 11:
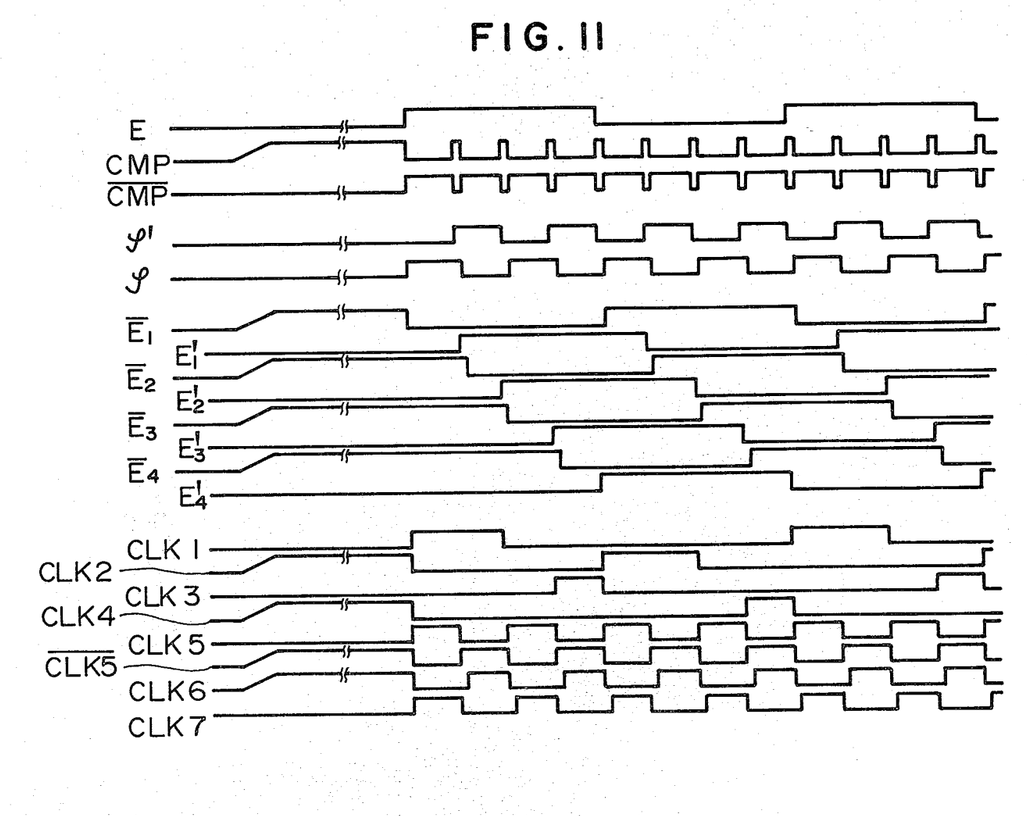

FIG. 6 shows a circuit arrangement of the flip-flop circuit 4. The flip-flop circuit 4 is comprised of inverters 41 to 45 and MOS switches 46 to 48. The switch 46 conducts in response to a start pulse CLK0 to render the input signal level of the inverter 41 at the time of start "0." The switches 47 and 48 are controlled in their ON/OFF operations by output pulses CMP and $\overline{CMP}$ derived from the comparator circuit. Accordingly, pulse signals $\overline{\psi}$, $\psi$, $\psi'$ and $\overline{\psi'}$ which are inverted in synchronism with the pulse CMP and $\overline{\text{CMP}}$ are obtained from the output circuits of the inverters 41, 42, 44 and 45, respectively. The waveforms ψ and ψ' are illustrated in FIG. 11.

Figure 7:
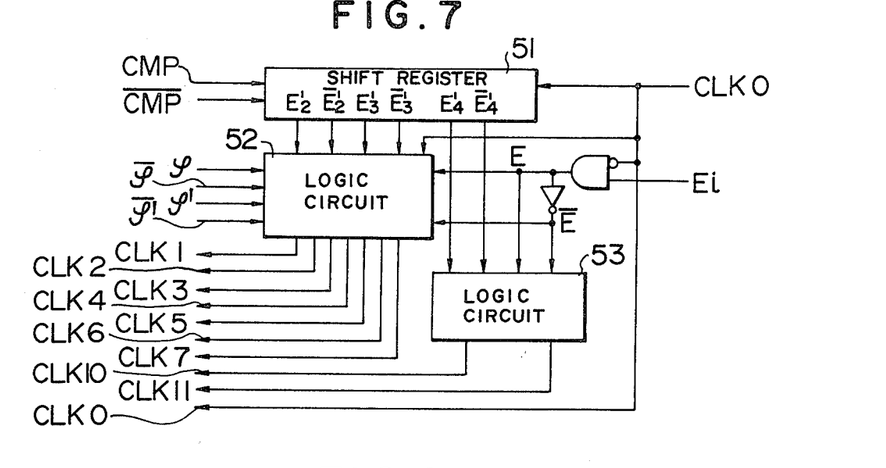
FIG. 7 is a block diagram of an embodiment of a timing pulse generating circuit shown in FIG. 1.

FIG. 7 shows an embodiment of a timing pulse generating circuit 5, in block form. In the figure, reference numeral 51 designates a shift register for producing pulses E2', $\overline{\text{E2'}}$, E3', $\overline{\text{E3'}}$, E4' and $\overline{\text{E4'}}$ with different phases but with the same pulse width as that of the reference pulse E. A logic circuit 52 is for generating timing pulses CLK1 to CLK7 necessary for controlling the reference voltage generating circuit 1 and the triangle wave voltage generating circuit 2 by using the output pulses ψ, $\overline{\psi}$, ψ' and $\overline{\psi'}$ from the flip-flop circuit 4 and the output pulses E2', $\overline{\text{E2'}}$, E3' and $\overline{\text{E3'}}$, from the shift register 51. A logic circuit 53 produces timing pulses CLK10 and CLK11 for determining the capacitor discharge period of the reference voltage generating circuit 1 by using the output pulses E4' and $\overline{\text{E4'}}$ derived from the shift register 51 and the reference pulses E and $\overline{\text{E}}$.

Figure 8:
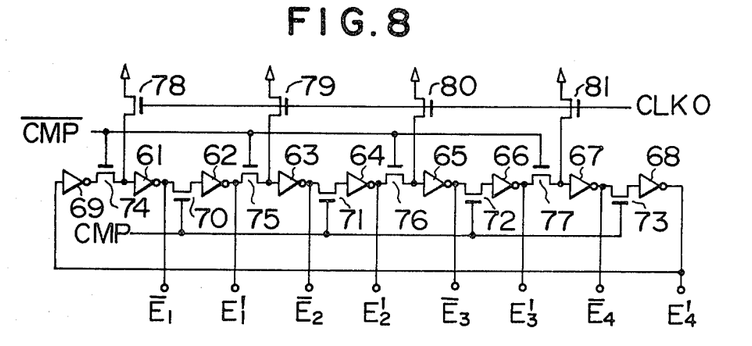
FIG. 8 is a circuit diagram of an embodiment of a shift register 51 used in the circuit shown in FIG. 7.

The shift register 51, as shown in FIG. 8, is comprised of inverters 61 to 69 recursively connected, MOS switches 70 to 77 for signal transfer control inserted between the adjacent inverters, and MOS switches 78 to 81 which are controlled in their conduction by a start pulse CLK0 for rendering "0" the input level to the inverters 61, 63, 65 and 67 at the time of start.

In the shift register, a signal transfer between the adjacent inverters except the inverters 68 and 69 is controlled by a pulse signal $\overline{\text{CMP}}$ applied to the switches 70 to 73 and an inverted pulse signal CMP applied to the switches 74 to 77. Accordingly, the output signals $\overline{\text{E1}}$ to E4' from the inverters 61 to 68 are those obtained by subsequently shifting the reference pulse E in synchronism with the pulse signals CMP and $\overline{\text{CMP}}$, as indicated by the waveforms $\overline{\text{E1}}$ to E4', shown in FIG. 11.

The logic circuit 52 performs the following logical formulae to produce pulses with waveforms CLK1 to CLK7 shown in FIG. 11.

CLK1 = $\overline{\text{E}}$ + E2'

CLK2 = $\overline{\text{E}}$ + $\overline{\text{E3'}}$ + CLK0

CLK3 = $\overline{\text{E}}$ + $\overline{\text{E3'}}$

CLK4 = $\overline{\text{E}}$ + $\overline{\text{E3'}}$

CLK5 = $\overline{\psi'}$·$\overline{\text{CLK0}}$

CLK6 = $\overline{\psi}$·ψ' + CLK0

CLK7 = ψ·$\overline{\psi'}$

Figure 9A:
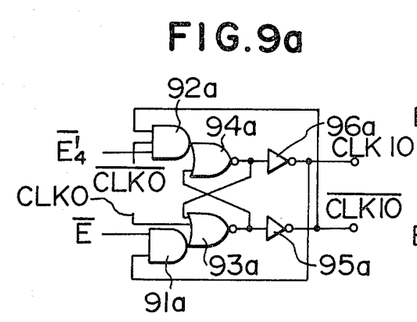
FIGS. 9a and 9b show the detailed circuit arrangements of a circuit 53 shown in FIG. 7.
Figure 9B:
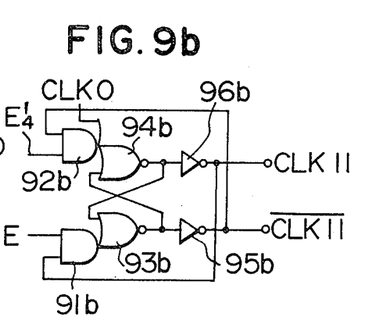
Figure 12A:
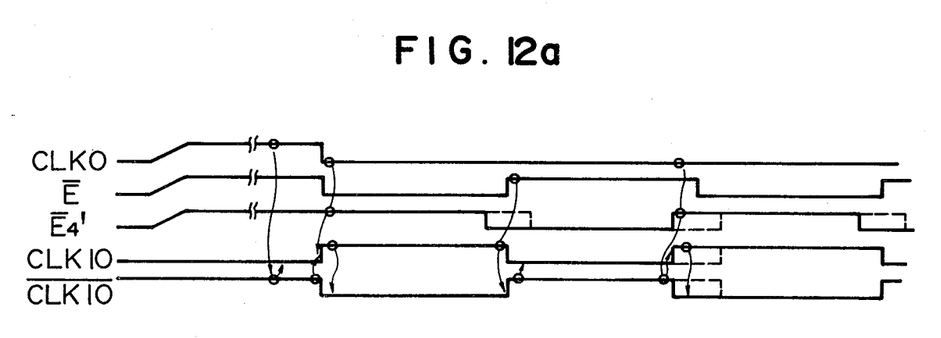
FIGS. 12a and 12b show signal waveforms useful in explaining the operation of the circuit shown in FIGS. 9a and 9b.
Figure 12B:
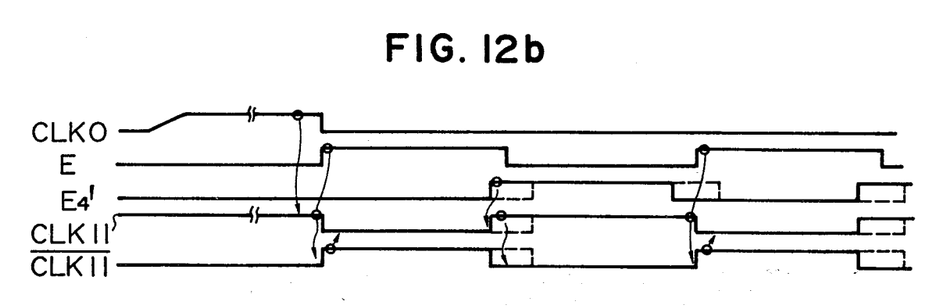

The logic circuit 53 for generating the pulses CLK10 and CLK11 is comprised of, as shown in FIGS. 9a and 9b, for example, a flip-flop circuit including AND gates 91a (91b), and 92a (92b), OR gates 93a (93b) and 94a (94b), and inverters 95a (95b) and 96a (96b). Time charts for illustrating the operation of the flip-flop circuit are shown in FIGS. 12a and 12b.

The circuit shown in FIG. 9a is conditioned such that $\overline{\text{CLK0}}$ = "1" and CLK10 = "0" when the start pulse CLK0 is "1." When the start pulse CLK0 = "0," the output of the AND gate 92a becomes "1," so that the output pulses CLK10 and $\overline{\text{CLK10}}$ are inverted. Subsequently, the circuit produces the pulse CLK10 which is set at the leading edge of the pulse $\overline{\text{E4'}}$ and is reset at the leading edge of the pulse $\overline{\text{E}}$.

The circuit shown in FIG. 9b also operates in a similar manner. Accordingly, the circuit produces the pulse CLK11 which is set at the leading edge of the pulse E4' and is reset at the leading edge of the pulse E.

As described above, in the pulse frequency multiplier circuit according to the invention, the reference voltage generating circuit 1 produces the reference voltage corresponding to the pulse width of the reference pulse every half cycle in response to the timing pulses CLK 1 to CLK11 outputted from the timing pulse generating circuit 5. The triangle wave voltage generating circuit 2 produces a triangle wave voltage repeating at the 1/n period of the reference pulse, so that the flip-flop circuit 4 produces a pulse with the frequency n times that of the reference pulse.

In the pulse frequency multiplying circuit of the above-mentioned embodiment, a time difference which occurs between the pulses E4' and $\overline{\text{E4'}}$ formed on the basis of the output pulse CMP and $\overline{\text{CMP}}$ from the comparator circuit and the input reference pulse E, is automatically corrected as in the following manner. In FIGS. 12a and 12b, continuous lines of the signals $\overline{\text{E4'}}$ and E4' indicate a case where the periods of those pulses ($\overline{\text{E4'}}$, E4') are shorter than that of the reference pulse E. A broken line indicates a case where the former periods are shorter than the latter. In the latter case, since the pulse CLK10 or the CLK11 is produced earlier than in a normal condition, the discharge time is elongated by a time corresponding to a time difference between it and the input pulse E, with the result that the reference voltage Vc1 and Vc2 may be restricted low. Therefore, the generating period of the pulses CMP and $\overline{\text{CMP}}$ becomes longer thereby to compensate for time differences between the pulses E and E4' and between $\overline{\text{E}}$ and $\overline{\text{E4'}}$. Conversely, when the periods of the pulses $\overline{\text{E4'}}$ and E4' are longer, the discharge time of the capacitor is shortened to decrease the generating periods of the pulse CMP and $\overline{\text{CMP}}$. In such a case where no automatic correcting function is required, the switches 12a and 12b for determining the discharge time of the capacitors C1 and C2 of the reference voltage generating circuit may be controlled by the reference pulse E of the external input signal and the inverted signal $\overline{\text{E}}$.

The description as given above relates to a case where the reference pulse E of 50% duty ratio is externally applied to the pulse frequency multiplier circuit. The pulse frequency multiplier circuit of the present invention is also operable normally even in the case of the duty ratio of other percentage than 50%. In that case, since the reference voltage generating circuit alternately produces the voltages Vc1 and Vc2 with different values every half cycle. Accordingly, it produces an output pulse ψ' with the same duty ratio as that of the reference pulse but the frequency n times that of the same.

What is claimed is:

1. A pulse frequency multiplying circuit comprising:
   a reference voltage generating circuit which after a first capacitor charged to a given potential is discharged at a fixed voltage attenuating rate of a period corresponding to the pulse width of a reference pulse, produces the terminal voltage of said first capacitor as a reference voltage;
   a triangle wave voltage generating circuit which alternately discharges a pair of second capacitors charged to a given potential at a voltage attenuating rate n times that of said first capacitor, and alternately produces in the form of a triangle wave shape an attenuated voltage obtained at the terminal of said second capacitors during the discharge period;

a comparator circuit for producing pulse when said reference voltage is coincident with said triangle wave voltage;

a flip-flop circuit which is driven by an output pulse from said comparator circuit; and a timing pulse generating circuit which responds to an output pulse from said flip-flop circuit and produce a timing signal for switching the charge/discharge operation of each of said second capacitors for transfer to said triangle wave voltage generating circuit, whereby a pulse of a frequency n times of said reference pulse is produced from said flip-flop circuit.

2. A pulse frequency multiplier circuit according to claim 1, wherein said reference voltage generating circuit includes a first capacitor and a first constant-current circuit, and wherein said triangle wave voltage generating circuit includes a pair of second capacitors and a second constant-current circuit, said first and second capacitors having the same capacitances, and said second constant-current circuit having a current value n times that of said first constant-current circuit.

3. A pulse frequency multiplier circuit according to claim 1, wherein said reference voltage generating circuit includes a first capacitor and a first constant-current circuit, and wherein said triangle wave voltage generating circuit includes a pair of second capacitors and a second constant-current circuit, said second capacitors each having 1/n capacitance of said first capacitor and said first and second constant-current circuits having the same current value.

4. A pulse frequency multiplier circuit according to claim 2 or 3, wherein said first capacitor of said reference voltage generating circuit includes a pair of third capacitors with the same capacitances, and said reference voltages are alternately produced from said pair of third capacitors.

5. A pulse frequency multiplier circuit according to claim 1, 2 or 3 wherein said timing pulse generating circuit produces a timing pulse for controlling the charge/discharge of said first capacitor of said reference voltage generating circuit in response to an output pulse from said flip-flop circuit.

6. A pulse frequency multiplier circuit according to claim 5, wherein said timing signal generating circuit includes a shift register which is driven by the output pulse from said comparator circuit to produce a plurality of pulses with different phases, a logic circuit for producing a first timing signal in response to an output pulse from said flip-flop circuit, a logic circuit for producing a second timing pulse in response to an output pulse from said shift register, and a logic circuit for producing a third timing pulse in response to an output pulse of said shift register and said reference pulse, whereby said triangle wave voltage is controlled by said first timing pulse and said reference voltage generating circuit is controlled by said second and third timing pulses.

* * * * *